Sept. 8, 1959 L. J. GIACOLETTO 2,903,628
SEMICONDUCTOR RECTIFIER DEVICES
Filed July 25, 1955
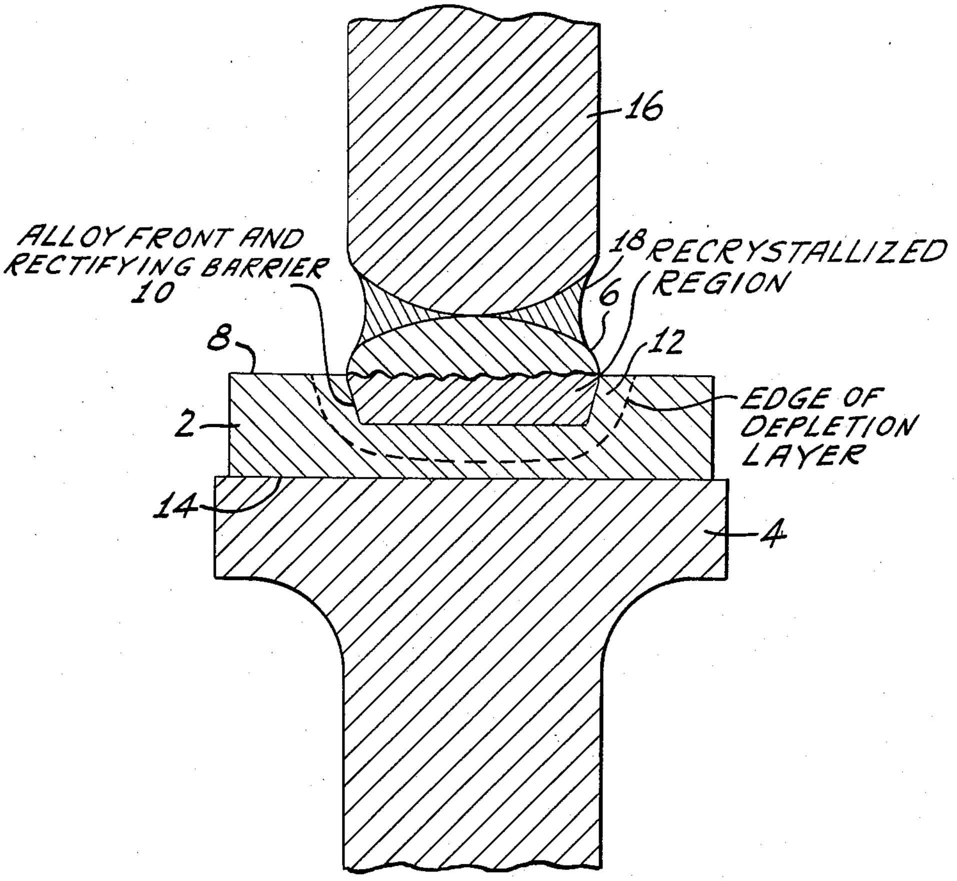
INVENTOR.
LAWRENCE J. GIACOLETTO
BY J. L. Whittaker
ATTORNEY 2,903,628

SEMICONDUCTOR RECTIFIER DEVICES

Lawrence J. Giacoletto, Princeton Junction, N.J., assignor to Radio Corporation of America, a corporation of Delaware Application July 25, 1955, Serial No. 524,209

8 Claims. (Cl. 317—234)

This invention relates to improved semiconductor rectifiers and more particularly to such rectifiers especially adapted for operation at relatively high electrical frequencies and with relatively small electrical losses.

The electrical losses of a solid state rectifying device are generally of increasingly critical nature as the frequency of operation of the device is increased. While many of the devices presently commercially available are satisfactory with respect to losses for operation at relatively low frequency, their performance is often inferior at relatively high frequencies.

One use of a semiconductor rectifier is as a variable capacitance in an automatic frequency control or frequency modulation circuit. When a semiconductor rectifier, or diode, is biased in its back, or high resistance, direction its electrical capacitance is inversely dependent on the magnitude of the bias voltage. A semiconductor diode may, therefore, be utilized as a voltage-responsive variable reactance in an oscillator circuit. Since the values of capacitance ordinarily found in these diodes are relatively small, of the order of micro-microfarads, the diodes being relatively small in physical size, such diodes are particularly advantageous for use in very high frequency oscillator circuits. For example, they may be used in the oscillator circuit of a color television receiver operating in the UHF band at frequencies of 500 mc./sec. and higher.

In such an application it is extremely important to minimize electrical losses in the rectifier. It is also important to maximize the variation in capacitance as a function of applied biasing voltage. The minimization of losses is also important in other applications where semiconductor rectifier find common usage such as in microwave mixer circuits.

Accordingly, one object of the instant invention is to provide improved semiconductor rectifier devices.

Another object is to reduce the electrical loss characteristics of semiconductor rectifier devices.

Another object is to improve the capacitance variation with respect to applied voltage of semiconductor rectifier devices.

Another object is to provide a semiconductor rectifier with improved general electrical properties for both continuous wave and pulse signal applications.

According to the instant invention it has now been found that both the loss characteristics and the capacitance variations of semiconductor rectifier devices may be improved by making a device incorporating the following features:

(*a*) A semiconductor body having a maximum ratio of electron mobility to relative permittivity and minimum resistivity consistent with the maximum reverse direction voltage to which the device will be subjected in operation;

(*b*) A base, or ohmic contact upon the semiconductor body spaced from the rectifying electrode a distance approximately equal to the maximum thickness of the depletion layer of the barrier, i.e., when the barrier is biased by a voltage just smaller than its breakdown voltage, the depletion layer extends from the barrier up to but not touching the base contact; and (*c*) If the rectifier device is to be utilized for rectification and in operation is to conduct current in its forward direction, then the minority carrier lifetime of the semiconductor material is made sufficiently short so that the diffusion length of minority carriers is much smaller than the distance between the ohmic contact and rectifying electrode.

The invention will be explained in greater detail in connection with the accompanying drawing of which the single figure is a schematic, cross-sectional, elevational view, greatly enlarged, of a rectifier device according to the invention.

A preferred embodiment of the invention is typified by the alloy junction germanium diode shown in the figure. This diode is particularly adapted for use as a voltage-responsive variable capacitor. It comprises a wafer 2 of n-type semiconductive germanium mounted in non-rectifying (ohmic) contact upon a conductive supporting member 4 which also serves as an electrical base connection. A rectifying electrode 6 is surface alloyed on the surface 8 of the wafer opposite from the supporting member. A rectifying barrier 10 of relatively large area and substantially parallel to the two major faces of the wafer is disposed in the wafer and electrically separates the electrode 6 from the bulk of the wafer.

A depletion layer, the edge of which is shown schematically by the broken line 12, is associated with the barrier. This layer is a region characterized by the presence of an electric field and a resulting, low concentration of electric charge carriers, the carriers being accelerated out of the region by the field. The depletion layer extends on both sides of the barrier but the portion on the electrode side in the present instance is relatively small and insignificant. The thickness of the depletion layer varies principally according to the resistivity of the wafer and the magnitude of the voltage applied across the barrier.

In a diode according to the invention the spacing between the barrier 10 and the opposite surface 14 of the wafer is made approximately equal to but not less than the thickness of the depletion layer in the bulk of the wafer when the barrier is biased to its breakdown voltage. Thus, the electrical resistance of the bulk of the wafer between the edge of the depletion layer and the base connection is minimized, while at the same time "punch-through" is prevented. Punch-through is an undesirable effect which permits excessive flow of electric current when the leading edge of the depletion layer contacts the base connection. (The depletion layer "punches through" the entire thickness of the wafer.)

In a diode according to the preferred embodiment of the invention designed particularly for use as a variable reactance device, the base wafer 2 may be a single crystal of n-type semiconductive germanium having a resistivity of about 0.1 ohm-cm. It may be in the form of a disc about .075" in diameter and .002" thick. The rectifying electrode may be a surface alloyed indium pellet about .020" in a diameter, .010" thick and penetrating about .0019" into the wafer. The conductive support forming the base connection may be of any convenient size and is preferably at least as large as the germanium wafer. It may be, for example, a Kovar nail head to which the wafer is soldered with tin-lead-antimony solder. The lead 16 which is soldered to the indium electrode 6 is preferably of a relatively large diameter in order to minimize its inductance. It may, for example, consist of a silver plated wire about .030" in diameter soldered to the indium electrode by simple melting of the indium or by the use of a relatively low melting point solder 18 such as Wood's metal.

A diode of these dimensions exhibits a capacitance at six volts reverse bias of about 36 $\mu\mu$fd. and a change in capacitance of about 3$\mu\mu$fd. per volt change in bias. The total reactance of the diode when connected in a circuit is, of course, somewhat affected by the inductance of the leads and by minor variations in processing.

The thickness of the depletion layer in a diode such as the one described which comprises an abrupt transition zone between a very low resistivity p-type semiconductor and a medium or high resistivity n-type semiconductor may be computed by the following equation:

$$W=[-2K\epsilon_0\mu_n]^{1/2}\sqrt{-\frac{V_0+V}{\sigma}}\text{ meters} \quad (1)$$

where:

$\mu_n$=mobility of electrons $\left(-0.36\frac{\text{m.}^2}{\text{volt sec.}}\text{ for relatively pure germanium}\right)$, $K$=relative permittivity=16 for germanium, $\epsilon_0$=permittivity of free space=$\frac{1}{36\pi}\times10^{-9}$ farads/meter, $V_0$=contact voltage (−0.4 v. for indium-enriched germanium), $V$=voltage (reverse and negative in sign) applied to junction in volts, $\sigma$=conductivity of the high resistivity semiconductor in mhos/meter.

It may be seen from this equation that at the six bolt bias heretofore specified the depletion layer is about .00004" thick, or somewhat thinner than the .0001" spacing between the barrier and the base connection. The difference between the theoretically required spacing and that actually incorporated in the device represents a manufacturing tolerance to allow for variations in alloying depth and for localized variations in the germanium.

*Figure of merit computations*

The junction capacitance of a junction type semiconductor diode arises from space charge in the depletion layer within the semiconductor. When a reverse voltage is applied across the junction the mobile charges are depleted from a zone or region (depletion layer) adjacent to the junction leaving uncompensated fixed charges in the region. The resulting capacitance may be formulated in a manner similar to a parallel plane capacitance as:

$$C=\frac{K\epsilon_0}{W}A\text{ farads} \quad (2)$$

where:

$K$=relative permittivity (16 for germanium), $\epsilon_0$=permittivity of free space, $A$=area of junction in square meters, $W$=effective width (depletion layer) of the capacitor in meters.

This relation may be written as follows by substituting the expression for W heretofore given:

$$C=\left[\frac{K\epsilon_0}{-2\mu}\right]^{1/2}\frac{A\sqrt{\sigma}}{\sqrt{-V_0+V}}\text{ farads} \quad (3)$$

The performance of a capacitor also involves a resistance factor. The effective resistance in series with the capacitor may be approximated by assuming that it is due to a cylinder of semiconductor whose area A is equal to the area of the junction and whose height $h$ is equal to the distance between the junction and the base connection. This resistance may be expressed as:

$$r=\frac{h}{A\sigma}\text{ ohms} \quad (4)$$

The measure of merit for a semiconductor diode when used as a capacitor may then be defined as the ratio of its capacitive reactance to its effective resistance:

$$Q=\frac{1}{2\pi fC}\cdot\frac{1}{r} \quad (5)$$

Substituting the expressions for C and $r$, the merit figure becomes:

$$Q=\frac{\sqrt{\sigma}(V_0-V)^{1/2}}{2\pi f\left[\frac{K\epsilon_0}{-2\mu}\right]^{1/2}} \quad (6)$$

It will be seen that the merit figure Q of a diode improves with increasing conductivity and also with an increasing ratio $\mu/K$. Thus, the semiconductive material in a diode according to the invention should be selected on the basis of its $\mu/K$ ratio and should have the highest conductivity consistent with the required reverse voltage breakdown characteristic.

The value of $\mu$ varies inversely to some extent with conductivity in all presently known semiconductive materials. The value of Q, therefore, does not increase continuously as the conductivity of a given material is increased but goes through a maximum value.

The maximum value of Q for n-type germanium is found when the conductivity is approximately 10,000 mhos per meter. This value is generally above the maximum conductivity consistent with breakdown characteristics in ordinarily acceptable ranges. With germanium, therefore, the variation of $\mu$ with conductivity and the consequent limitation of Q are not dominant factors. The conductivity may be made as high as possible considering only the required breakdown voltage. In other materials, however, it may be that the maximum of Q occurs within practicable conductivity ranges and that the variation of $\mu$ as a function of conductivity would then have to be considered.

On the basis of the ratio of $\mu/K$, n-type germanium is the best presently known semiconductive material for use in diode capacitors according to the invention. Of the presently known available materials, germanium, silicon and their alloys, n-type germanium has the largest ratio of $\mu/K$; in the units heretofore employed the ratio for n-type germanium is .0244 meter²/volt-sec.

Once the material is selected the primary determinant of a diode according to the instant invention is the maximum voltage the diode must stand in operation. The maximum voltage determines the minimum resistivity of the semiconductive material since in all known materials the breakdown voltages of rectifying barriers vary directly with the resistivity of the materials.

As shown by S. Miller in an article for the Physical Review, August 15, 1955, entitled, "Avalanche Breakdown in Germanium," for moderately low resistivity n-type semiconductive germanium (10 ohm-cm. or less) the breakdown voltage $V_B$ is given approximately by the relationship:

$$V_B=2.46\times10^3(P)^{.725}\text{ volts} \quad (7)$$

where:

$P$=the resistivity of the material in ohm-meters.

Since the thickness of the depletion layer is also a function of the resistivity of the material the resistivity taken together with the breakdown voltage of the barrier determines the minimum spacing between the barrier and the base connection. This spacing is made as nearly equal as possible to the thickness of the depletion layer at a voltage just short of breakdown. It should be made somewhat thicker than the minimum value, however, in order to accommodate manufacturing tolerances and to insure that a large proportion of the units produced have a spacing at least as great as the desired spacing.

The total capacitance and other parameters of the diodes such as their current carrying ability in the forward direction and their saturation currents when biased in the back direction may be varied by changing the size of the rectifying electrode. A relatively large area electrode provides a relatively large capacitance, relatively high forward current carrying ability and relatively high reverse saturation currents.

All of the foregoing considerations apply equally to diodes that are utilized as rectifying devices such as microwave mixers and high frequency detectors. In such diodes, however, the minority carrier lifetime characteristic of the semiconductive material is also of importance. The lifetime characteristic in diodes designed for rectification at high frequencies should be sufficiently short that the average diffusion length of the minority carriers is much smaller than (e.g., by at least a factor of five) the distance between the barrier and the base contact. In the device heretofore described in connection with the preferred embodiment of the invention a lifetime characteristic of 0.01 microsecond or less satisfies this requirement.

The lifetime characteristics of semiconductive materials may be minimized by known techniques such as electron or nuclear particle bombardment or incorporating certain impurities such as copper or nickel in the materials during their preparation.

The diodes according to the invention may be made by conventional manufacturing techniques. They should be given the best known surface treatments preparatory to potting in order to reduce surface recombination effects and to minimize electrical leakage paths on the surface which may electrically bypass the barriers and thus adversely affect their characteristics.

The invention is not limited to the particular alloy junction type device heretofore described, but is also applicable to rectifiers utilizing point contact, line contact and area contact electrodes.

There have thus been described improved semiconductor diode devices having improved properties both with respect to capacitance and to rectification. The devices closely approximate the ideal diode characteristics as given by the relationship:

$$I=I_s\left(e^{\frac{qV}{kT}}-1\right) \quad (8)$$

where $I$=diode current, $V$=diode voltage, $I_s$=saturation current=diode current when diode voltage is greater than a few tenths of a volt in the reverse direction, $\frac{q}{kT}$=constant=38.6 at 27° C. temperature.

They are also particularly well suited for use in so-called pulse type circuit applications because the close spacing between their barriers and their base contacts minimizes transit time dispersion of the minority charge carriers and permits the transmission of a pulse with minimum distortion.

What is claimed is:

1. A semiconductive rectifier device comprising a semiconductive wafer having opposed faces, a large area ohmic contact upon one face of said wafer and a rectifying electrode upon the opposite face of said wafer, a rectifying barrier associated with said electrode and spaced from said ohmic contact a distance approximately equal to and at least as great as the maximum thickness of the depletion layer associated with said barrier in said wafer, said wafer having a preselected minimum resistivity.

2. A semiconductive rectifier device comprising a wafer of n-type semiconductive germanium having opposed faces, a large area ohmic contact upon one face of said wafer and a rectifying electrode upon the opposite face of said wafer, a rectifying barrier associated with said electrode and spaced from said ohmic contact a distance approximately equal to and at least as great as the maximum thickness of the depletion layer associated with said barrier in said wafer, said wafer having a preselected minimum resistivity.

3. A semiconductive rectifier device comprising a wafer of n-type semiconductive germanium having opposed faces, a large area ohmic contact upon one face of said wafer and a surface alloyed rectifying electrode upon the opposite face of said wafer, a rectifying barrier associated with said electrode and spaced from said ohmic contact a distance approximately equal to and at least as great as the maximum thickness of the depletion layer associated with said barrier in said wafer, said wafer having a preselected minimum resistivity.

4. A semiconductive rectifier device comprising a wafer of n-type semiconductive germanium having opposed faces, a large area ohmic contact upon one face of said wafer and a rectifying electrode upon the opposite face of said wafer, a rectifying barrier associated with said electrode and spaced from said ohmic contact a distance, W as defined by:

$$W=[-2K\epsilon_0\mu_n]^{1/2}\sqrt{-\frac{V_0+V}{\sigma}}\text{meters}$$

where:

$\mu_n$=mobility of electrons $\left(-0.36\frac{\text{m.}^2}{\text{volt sec.}}\text{ for relatively pure gemanium}\right)$, $K$=relative permittivity=16 for germanium, $\epsilon_0$=permittivity of free space$=\frac{1}{36\pi}\times10^{-9}$ farads/meter, $V_0$=contact voltage (−0.4 v. for indium-enriched germanium), $V$=breakdown voltage of barrier (negative in sign), $\sigma$=conductivity of the high resistivity semiconductor in mhos/meter.

5. A semiconductive rectifier device comprising a wafer of n-type semiconductive germanium having opposed faces and having a resistivity of about 0.1 ohm-cm., a large area ohmic contact upon one face of said wafer and a surface alloyed indium electrode upon the opposite face of said wafer, a rectifying barrier associated with said indium electrode, said barrier being spaced within about .0001″ of said ohmic contact.

6. A semiconductive rectifier device comprising a wafer of n-type semiconductive germanium having opposed faces and having a resistivity of about 0.1 ohm-cm. and a minority lifetime characteristic smaller than .01 microsecond, a large area ohmic contact upon one face of said wafer and a surface alloyed indium electrode upon the opposite face of said wafer, a rectifying barrier associated with said indium electrode, said barrier being spaced within about .0001″ of said ohmic contact.

7. A semiconductive rectifier device comprising a semiconductive wafer having opposed faces, a large area ohmic contact upon one face of said wafer and a rectifying electrode upon the opposite face of said wafer, a rectifying barrier including a depletion layer associated with said electrode, said barrier being spaced from said ohmic contact a distance approximately equal to and at least as great as the maximum thickness of said depletion layer, said wafer having a preselected minimum resistivity and a ratio of electron mobility to relative permittivity of at least .0244 square meter per volt-second.

8. A method of producing a semiconductor rectifier having improved variation of capacitance with voltage change when biased in the high resistance direction, said semiconductor rectifier consisting of a semiconductive material having opposed faces and a preselected minimum resistivity determining a breakdown voltage greater than the maximum biasing operating voltage for said rectifier, comprising forming an ohmic contact on one face of said semiconductor material, and forming a rectifying barrier penetrating an opposite face thereof to a distance spaced from said ohmic contact and approximately equal to and at least as great as the distance of the maximum depletion layer from said barrier in said semiconductive material.

References Cited in the file of this patent

UNITED STATES PATENTS 2,742,383 Barnes et al. ------------ Apr. 17, 1956